United States Patent

[11] 3,599,000

[72] Inventors Hisayoshi Yanai; Takayuki Sugeta; Masatoshi Migitaka; Hisao Nakashima; Yasuo Matsukura; Kuniichi Ohta, all of Tokyo, Japan

[21] Appl. No. 806,927
[22] Filed Mar. 13, 1969
[45] Patented Aug. 10, 1971

[73] Assignees Hitachi, Ltd. Tokyo, Japan; Nippon Electric Company, Limited Tokyo, Japan

[32] Priority Mar. 15, 1968
[33] Japan
[31] 17198/68

[54] SEMICONDUCTOR OPTOELECTRONIC LOGIC ELEMENT UTILIZING THE GUNN EFFECT

6 Claims, 4 Drawing Figs.

[52] U.S. Cl. 250/211 R, 250/213 A, 250/217 SS, 307/205

[51] Int. Cl. H01j 31/50, H01j 39/12, H03k 19/08

Figure 1A:
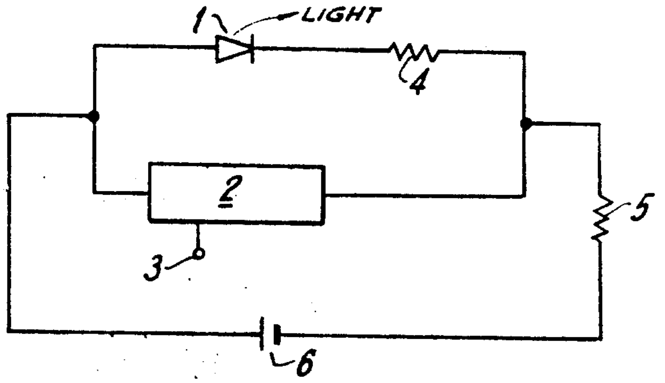

[50] Field of Search 250/213 A, 211, 211 J, 217 SS, 217 SI; 307/205

[56] References Cited

UNITED STATES PATENTS

| | | | |
|---|---|---|---|
| 3,245,002 | 4/1966 | Hall | 250/217 SSL UX |
| 3,365,583 | 1/1968 | Gunn | 307/205 |
| 3,440,425 | 4/1969 | Hutson et al. | 250/211 X |
| 3,47[illegible] | 10/1969 | Weinberger | 307/205 |

*Primary Examiner*—James W. Lawrence
*Assistant Examiner*—T. N. Grigsby
*Attorney*—Sandoe, Hopgood and Calimafde ABSTRACT: A semiconductor device for use as a logic element wherein a Gunn effect element is placed in optical coupling relationship with a plurality of semiconductive light emissive elements on a common semiconductor substrate. The Gunn effect element exhibits a photoconduction effect when irradiated by the light from the light emissive elements to provide AND or OR logic function depending upon the intensity of the irradiating light.

INVENTORS
HISAYOSHI YANAI
TAKAYUKI SUGETA
MASATOSHI MIGITAKA
HISAO NAKASHIMA
YASUO MATSUKURA
KUNIICHI OHTA

BY Sandoe, Hopgood & Calimafde
ATTORNEYS

SEMICONDUCTOR OPTOELECTRONIC LOGIC ELEMENT UTILIZING THE GUNN EFFECT

This invention relates to a semiconductor device for use as a logic circuit capable of high-speed switching operation by using a Gunn effect element and a semiconductor light-emissive element therein.

To realize a high-speed logic circuit, it has been recently proposed to use a Gunn effect element as an active element. The Gunn effect element-switching operation is faster than that of silicon or germanium transistors. This Gunn effect element is known as an element capable of high-speed switching operation as explained in U.S. Pat. No. 3,365,583. However, this element has not been put to practical use in high-speed logic circuits because it presents problems with regard to input and output connections when the element is incorporated with an integrated circuit.

The Gunn effect element is made of a material of the bulk negative resistance type capable of supporting a high field domain traveling from a cathode end to an anode end when the field intensity within the element exceeds a threshold value. The electric field is established by a level whereby an external trigger may produce the desired high field domain. And also, the high field domain once formed is sustained and propagated along the element by an electric field having an intensity larger than a sustaining value.

An object of this invention is to provide a practical semiconductor device suitable for use in high-speed logic circuits in which the Gunn effect element is incorporated into an integrated circuit.

The above-mentioned and other features and objects of this invention and the manner of attaining them will become more apparent and the invention itself will best be understood by reference to the following description of am embodiment of the invention taken in conjunction with the accompanying drawings as described below.

The semiconductor device of this invention is an integrated logic circuit which comprises a Gunn effect element and a semiconductor laser element for applying a light control signal to the Gunn effect element. The semiconductor laser element is closely disposed adjacent the Gunn effect element on a common substrate. A photoconduction effect is induced in the Gunn effect element which, upon irradiation from the semiconductor laser element, controls the Gunn effect element.

Figure 1B:
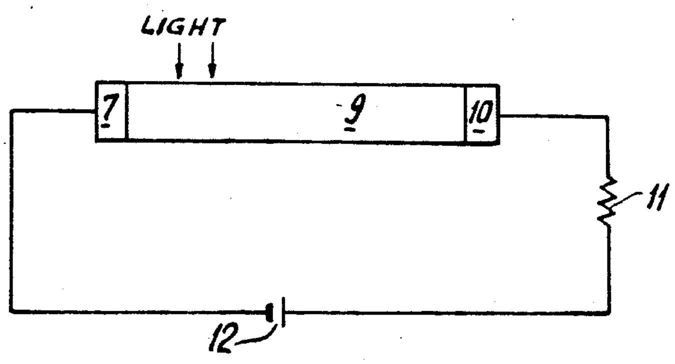
Figure 2:
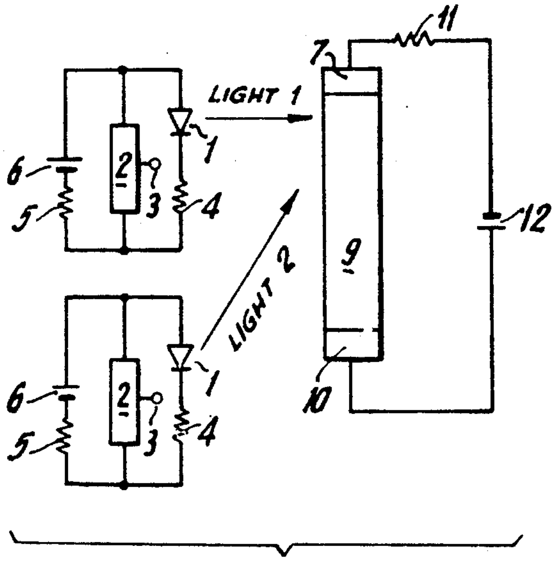
Figure 3:
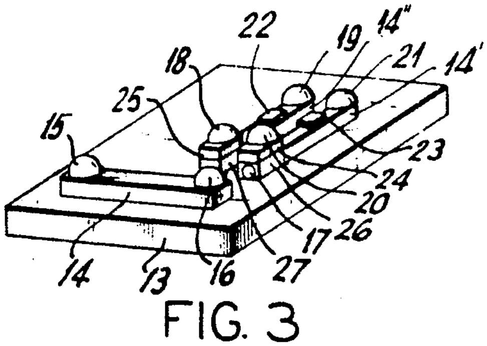

To facilitate an understanding of the above-mentioned features, the present invention will be described more specifically in conjunction with the accompanying drawings, in which:

FIGS. 1*a* and 1*b* are circuit diagrams showing a light-emitter and a light-receptor, respectively, which are employed for this invention; and FIGS. 2 and 3 are a circuit diagram and a perspective view, respectively, of a preferred embodiment of this invention.

Referring to FIG. 1*a*, the light-emitter employed for the present invention comprises a semiconductor laser diode 1, a Gunn effect element 2 which is connected in parallel to the laser diode 1, a power source 6 for biasing the laser diode 1 and the Gunn effect element 2 normally at a value slightly lower than their respective threshold values, a resistor 4, and a resistor 5. Upon applying a pulse to a gate 3 of the Gunn effect element 2, a high electric field domain is formed in the Gunn effect element 2 to reduce the current flowing therethrough. As a result, the current flowing in the laser diode 1 exceeds the threshold value of diode 1 and a laser light is generated. When only one high field domain is formed within the Gunn effect element 2 by the pulse applied to the gate 3, the laser light from the laser diode 1 becomes only one pulsed light.

Referring to FIG. 1*b*, the light-receptor employed for this invention comprises, as explained in the copending U.S. Pat. application, Ser. No. 748,680, filed July 30, 1968 and assigned to one of the assignees, a Gunn effect element consisting of a gallium-arsenide crystal 9 and electrodes 7 and 10 disposed at the respective ends of the crystal. A load resistor 11 for utilizing a controlled Gunn oscillation is coupled between electrode 10 and a power source 12 for exciting said Gunn effect element at a value smaller than the threshold value. When light is irradiated upon the Gunn effect element 9, a photoconduction effect is brought about in the irradiated portion, thereby producing a high field domain in a portion other than the irradiated portion of the Gunn effect element and thus generating a current pulse. The theory of this phenomenon is believed to be as follows: When the Gunn effect element 9 is irradiated by a light having an energy level which can excite electrons in the valence band of the Gunn effect element, the electrons at the irradiated portion are pumped up to the conduction band of the Gunn effect element, and hence hole-electron pairs are generated locally, thereby reducing the resistance at the irradiated portion and consequently lowering the overall resistance of the Gunn effect element. This causes an increase in the current flowing across the Gunn effect element, which raises the Gunn effect element field in the vicinity of the cathode end beyond a threshold value and results in the launching of the high field domain.

FIG. 2 shows a semiconductor device of a preferred embodiment of this invention. This semiconductor device is a logic circuit comprising a Gunn effect element 9 and two light-emitters for irradiating the Gunn effect element 9 of the light-receptor. This logic circuit operates as an OR circuit by fixing either the laser light output of the light-emitter or the bias value of the power source of the Gunn effect element of the light-receptor at such a value that an electric pulse is obtained from said Gunn effect element of the light-receptor only upon irradiation of laser light from at least one of the two emitters. This logic circuit can also operate as an AND circuit by setting the laser light output or the bias value of the Gunn effect element at such a low value that a current pulse is obtained therefrom only when the receptor is irradiated by the laser light from both emitters at the same time.

Furthermore, switching functions of the OR and AND circuits can be changed by adding another laser light which irradiates the Gunn effect element 9 of the light-receptor. Switching is done depending upon the effect of the photoconduction on the Gunn element. This other laser light may be considered as a light bias.

FIG. 3 illustrates a semiconductor device which provides a concrete structure of a logic circuit embodying this invention. This semiconductor device comprises a highly resistive galliumarsenic substrate 13, epitaxial layers 14, 14' and 14'' (*n*-type, impurity concentration $10^{15}/cm.^3$) which are each used as Gunn effect regions associated with the light-emitter and light-receptor. The light-emitter and light-receptor are separately formed on the substrate through an etching process. N-type high-concentration regions 26 and 27 are obtained by diffusing sulfur partly in said epitaxial layers 14' and 14''; *p*-type regions 24 and 25 which are formed by liquid growth. Ohmic electrodes 15 through 21 are made up by alloying indium. Control electrodes 22 and 23 supply triggering input signals to each of the Gunn effect regions 14' and 14'' and are placed between the *n*-type region 26 and the ohmic electrode 21 and between the *n*-type region 27 and the ohmic electrode 19, respectively. In such semiconductor device, laser light generated from a *p-n* junction plane formed between each of *n*-type high concentration regions 26 and 27 and the *p*-type regions 24 and 25 irradiates a Gunn effect region of a light-receptor located between electrodes 15 and 16. This semiconductor device is operated by connecting a first power source between electrodes 15 and 16 for maintaining the Gunn effect element field of the Gunn effect element 14 at a value slightly below its threshold value, providing means for utilizing the controlled Gunn oscillation between the cathode end of the power source and one end of the Gunn effect element 14, connecting a second power source between the electrodes 20 and 21 and between the electrodes 18 and 19 for maintaining the fields of the Gunn effect elements 14' and 14'' at a value slightly smaller than its threshold value, and applying a pulse or a series of pulses to the gates 22 and 23 to induce high field domains in a desired time relation within the Gunn effect elements 14' and 14'' and to control the oscillation in the Gunn effect element 14.

As has been explained, this invention is characterized in that a Gunn effect element and a semiconductor laser element are disposed closely adjacent each other on a common substrate, with sufficiently close spacing to prevent attenuation of the lasing lights from the semiconductor laser elements and realize efficient photocoupling between the Gunn effect element and the semiconductor laser elements. According to this invention, a super-high-speed logic device of extremely high reliability can be obtained without the problems produced by lead inductance and stray capacitance present in conventional logic devices.

Furthermore, this invention is applicable also to a semiconductor device in which a laser light is generated from a semiconductor laser element in different directions to be intercepted by a plurality of Gunn effect elements selectively placed to produce current pulses in the manner described for the embodiment of FIG. 3. If desired, the semiconductor laser element may be replaced with other known light-emissive element, such as a semiconductor luminescence element.

While the invention has been explained in detail, it is to be understood that the technical scope of the invention is not limited to that of the foregoing embodiment but applicable to all semiconductor devices as stated in the claims.

We claim:

1. A semiconductor device comprising a gallium-arsenide semiconductor body of the bulk negative resistance type operatively exhibiting a Gunn oscillation upon the application thereto of an electric field in excess of a threshold value along a given direction; means for applying to said body a biasing voltage which normally provides an electric field below said threshold value in said body along said given direction; and first and second light-emissive gallium-arsenide semiconductor elements located adjacent said semiconductor body for irradiating a part of said semiconductor body with light capable of inducing a photoconduction effect in said body.

2. A semiconductor device comprising a semiconductor body of the bulk effect type operatively exhibiting Gunn oscillation upon the application thereto of an electric field in excess of a threshold value, means for applying a biasing signal to said body for normally providing an electric field in said body below said threshold value, first and second light-emissive devices disposed adjacent said body for irradiating parts of said body with light emitted thereby, each of said light-emissive devices further including a controlling Gunn effect element, a laser element coupled to said controlling Gunn effect element, and means for biasing said controlling Gunn effect element and said laser element to a value which is sufficient to cause said laser element to emit and not to emit laser light depending upon the presence and absence of high field domains in said controlling Gunn effect element, respectively.

2. The semiconductor device according to claim 2 wherein, said controlling Gunn effect element has a gate electrode, said biasing means normally providing in said Gunn effect element a field below a threshold value necessary to generate the high field domain and at the same time providing a current in said laser element whose level is varied between a value below a threshold level necessary to generate laser light and a value above the threshold level in accordance with the change in the state of the absence and the presence of the high field domain in said Gunn effect element, and triggering means coupled to said gate electrode for supplying a control pulse to said gate electrode to allow said Gunn effect element to generate the high field domain therein, whereby pulsed laser light is obtained from said laser element under the control of said triggering means.

4. The semiconductor device according to claim 3, wherein said controlling Gunn element and said laser element are connected to said biasing means in a parallel relationship.

5. The semiconductor device according to claim 2, wherein said semiconductor body, said controlling Gunn effect element, and said laser element are all provided on a common semiconductor substrate.

6. The semiconductor device according to claim 5, wherein said semiconductor body, said controlling Gunn effect element, said laser element, and said semiconductor substrate are all formed of GaAs.